United States Patent [19]
Chen et al.

[11] Patent Number: 5,978,266
[45] Date of Patent: Nov. 2, 1999

[54] ARRAY VSS BIASING FOR NAND ARRAY PROGRAMMING RELIABILITY

[75] Inventors: Pau-ling Chen, Saratoga; Shane C. Hollmer, San Jose; Binh Q. Le, Mountain View; Michael S. Chung, San Jose, all of Calif.

[73] Assignee: Advanced Micro Devices, Inc., Sunnyvale, Calif.

[21] Appl. No.: 09/024,880

[22] Filed: Feb. 17, 1998

[51] Int. Cl.[6] .................................................. G11C 16/04
[52] U.S. Cl. ................. 365/185.17; 365/185.02; 365/185.28
[58] Field of Search ................... 365/185.02, 185.17, 365/185.28

[56] References Cited

U.S. PATENT DOCUMENTS 5,204,839  4/1993  Lee et al. ................................. 365/204

*Primary Examiner*—David Nelms
*Assistant Examiner*—Andrew Q. Tran
*Attorney, Agent, or Firm*—Skjerven, Morrill, MacPherson, Franklin & Friel, LLP; Tom Chen

[57] ABSTRACT

A method is provided for biasing a NAND array EEPROM during programming to allow the array to be scaled down further before reach punchthrough. The sources of the ground-select transistors of the NAND array are biased at $V_{cc}$ instead of ground to reduce the voltage drop across the source and drain of the ground-select transistors. As a result, the channel length of the ground-select transistors can be further shortened before punchthrough is obtained, resulting in a higher density EEPROM.

17 Claims, 4 Drawing Sheets

ARRAY VSS BIASING FOR NAND ARRAY PROGRAMMING RELIABILITY

BACKGROUND

1. Field of Invention

The present invention relates to semiconductor memory arrays, and more particularly to NAND arrays biased to reduce punchthrough.

2. Related Art

As semiconductor technology progresses, smaller and higher density chips are desired to accommodate the need for smaller and more powerful devices. One approach toward achieving this goal is to increase the integration density of semiconductor memories, such as EEPROMs, by reducing the physical dimensions of the EEPROM. One type of EEPROM designed to attain a high integration density is comprised of columns of NAND strings, each string having a plurality of memory cells with select transistors at the ends of each array, all of which are formed as one unit. The integration density of this type of EEPROM can be further increased by decreasing the channel length of individual memory cells or transistors comprising the NAND strings. However, if transistors such as MOSFETs are scaled down to channel lengths less than approximately 2 µm, a problematic "short-channel" effect called punchthrough can arise.

Punchthrough is associated with the merging of source and drain depletion layers in the MOSFET, i.e., when the drain depletion layer extends across the substrate and reaches the source layer, thereby causing a destructive conduction path or leakage current between the source and drain. A drain depletion layer forms and spreads as the voltage applied across the transistor from the drain to the source ($V_{DS}$) is increased. At a certain $V_{DS}$ called the punchthrough voltage, the width of the drain depletion layer approaches the spacing between the source and drain (i.e., the channel length), and the depletion regions meet, resulting in punchthrough. As MOSFET dimensions are scaled down, the channel length is reduced. Because channel length is reduced, the drain depletion layer reaches the source quicker as $V_{DS}$ is increased, resulting in punchthrough at lower drain/source voltages.

In MOSFETS with channel lengths greater than about 2 µm, punchthrough is not a limiting factor for channel lengths. However, as channel lengths are shortened to the range of approximately 1–2 µm, leakage currents through the drain of the MOSFETs occur at voltages below the avalanche-breakdown value to cause punchthrough. FIG. 1 shows a typical curve of the maximum drain voltage (with the source grounded) as a function of channel length. As seen, punchthrough is a serious problem in short-channel devices with a channel length less than about 2 µm.

Therefore, the ability to scale down MOSFETs is limited by the punchthrough voltage. In other words, high drain/source voltages necessarily increase the minimum channel length of short-channel MOSFETS. As a result, reducing the channel length of transistors in the EEPROM is constrained due to high drain/source voltages needed for programming the EEPROM, which limits the amount that the EEPROM can be physically reduced.

Accordingly, an EEPROM is desired that can be scaled down with reduced punchthrough effects.

SUMMARY

The present invention provides a method of biasing a NAND EEPROM array during programming to reduce punchthrough and allow an increased scale-down of the array by applying $V_{cc}$ instead of ground to the source of the bottom select gates of the NAND array.

The NAND array comprises a plurality of NAND strings, each NAND string having floating gate memory cells, serially connected at the shared source/drain regions of each memory cell. A bit- or column-select transistor is connected at one end of the NAND string to select the desired NAND string, and a ground-select transistor is connected at the other end to isolate adjacent NAND strings. The drain of each bit-select transistor is connected to a separate bit-line, and the source of each ground-select transistor is connected to ground or to a common signal line. The gates of each row of bit-select transistors are connected to a common line, and the control gates of each row of memory cell cells are commonly connected to separate word-lines. A memory cell from the NAND array can be programmed by selecting the desired NAND string and desired memory cell within that string.

For a programming operation, a pass voltage (i.e., approximately 10 V) is applied to the word-lines not connected to the desired memory cell, and a programming voltage (i.e., approximately 18 V) is applied to the word-line connected to the desired memory cell. The particular NAND string connected to the desired memory cell is selected by applying, for example, approximately 0 V to the desired bit-line and $V_{cc}$ (i.e., 3 V) to the undesired bit-lines. $V_{cc}$ is also applied to the select gates of each bit-select transistor in the array.

As a result, the bit-select transistor of the desired NAND string is turned on, while the bit-select transistors of all undesired NAND strings are turned off, thereby allowing the desired memory cell to be programmed and undesired memory cells to act as pass transistors in the selected NAND string. Adjacent unselected bit-lines can be isolated by applying, for example, approximately 0 V or ground to each select gate and $V_{cc}$ to each source of the ground-select transistors. By applying these voltages, the channel for the undesired bit-lines are boosted to approximately 7 V. Therefore, the channel side of each unselected bit-select transistor becomes the drain and the side biased at $V_{cc}$ becomes the source because of the higher potential from the channel region. Since the gate of each bit-select transistor is also biased at $V_{cc}$, the voltage drop across the gate and source is 0 volts, thereby shutting off the transistor and preventing leakage to adjacent NAND strings.

Therefore, by biasing the source of each ground-select transistor at $V_{cc}$ during programming, the voltage drop across the drain and source (or channel) of ground-select transistors in unselected bit-lines is reduced, which reduces the extent that a drain depletion region will spread within the transistor substrate. Consequently, the channel length of the transistor can be shortened to a greater extent prior to reaching punchthrough, thereby allowing higher density memory arrays to be placed within a chip.

The present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

According to the present invention, a method is provided for programming a NAND array EEPROM by biasing the source of the ground-select transistor in each NAND string at $V_{cc}$ to reduce the voltage drop across the source and drain of the transistor, thereby reducing punchthrough effects as the transistor is being scaled down.

Figure 2:
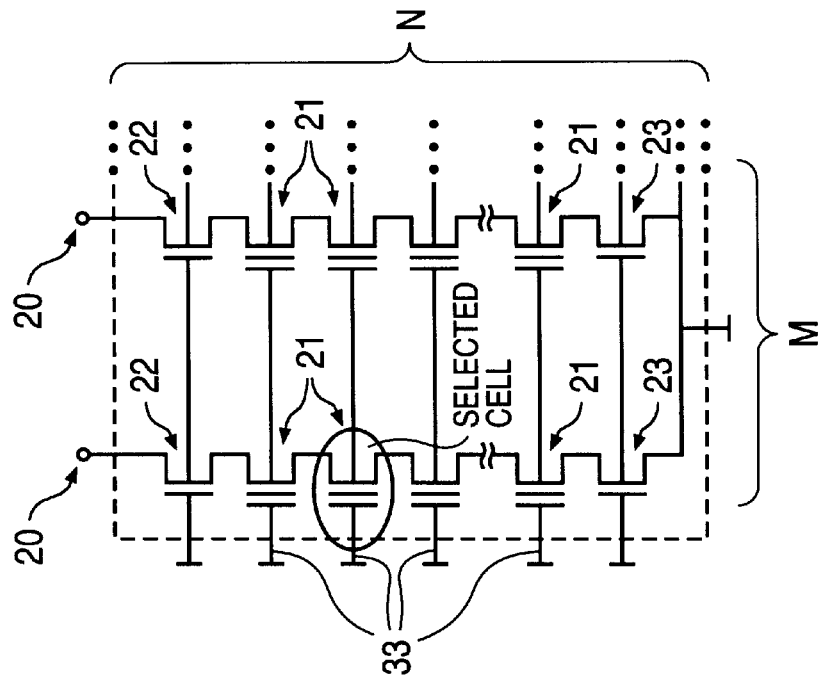
FIG. 2 is circuit illustration of a NAND array.
Figure 1:
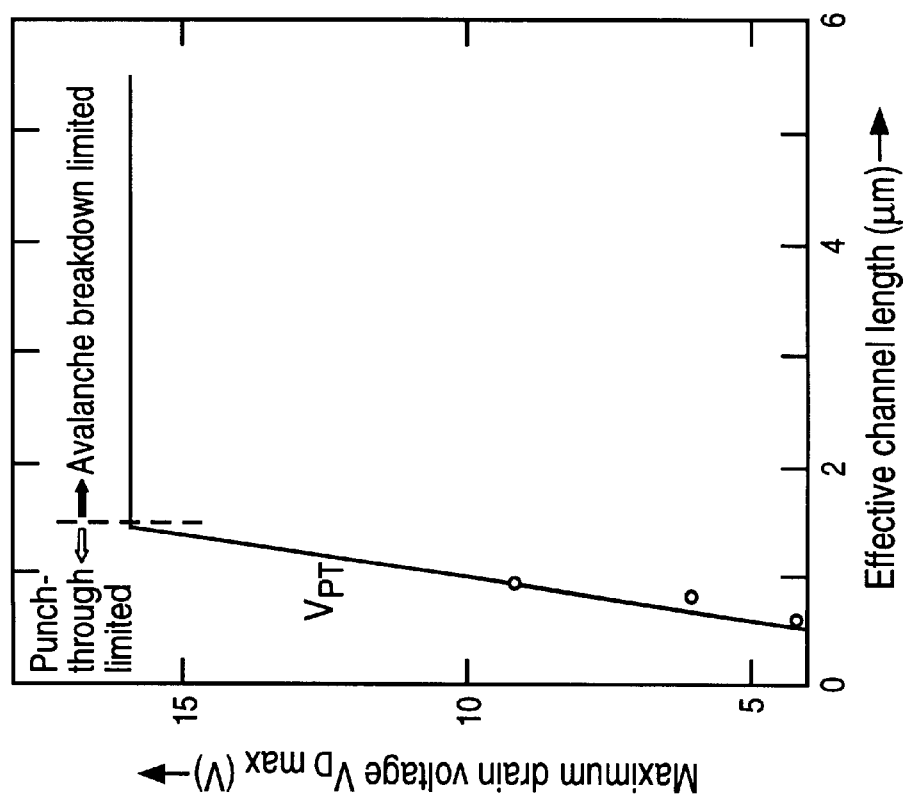
FIG. 1 is a graph of channel length as a function of drain voltage for a MOSFET.
Figure 3A:
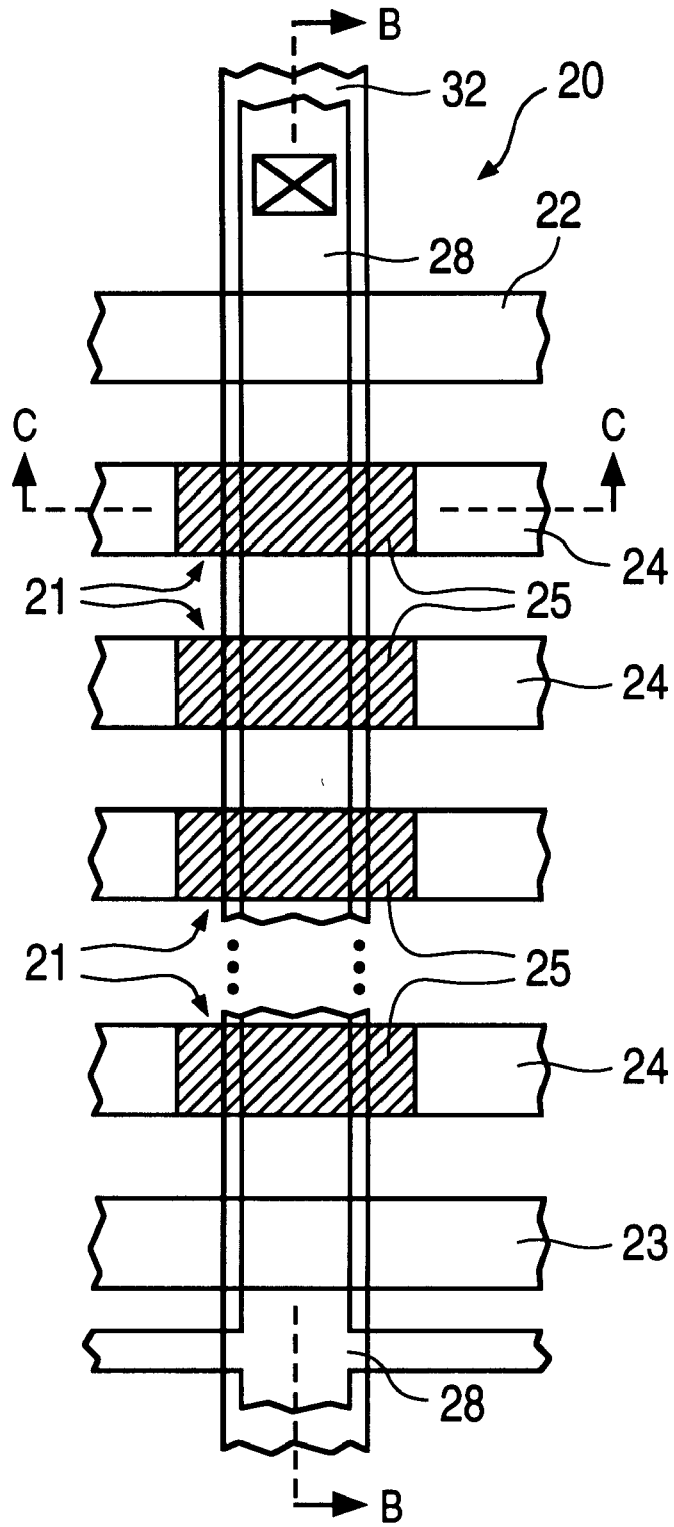
FIG. 3A is a top view of a NAND string of FIG. 2.
Figure 3B:
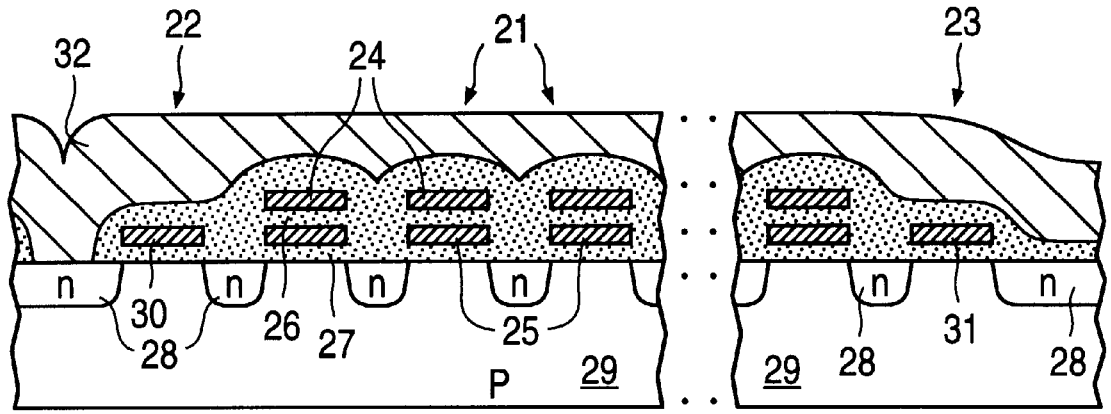
FIGS. 3B and 3C are sectional views of the NAND string of FIG. 3A along sectional lines B—B and C—C, respectively.
Figure 3C:
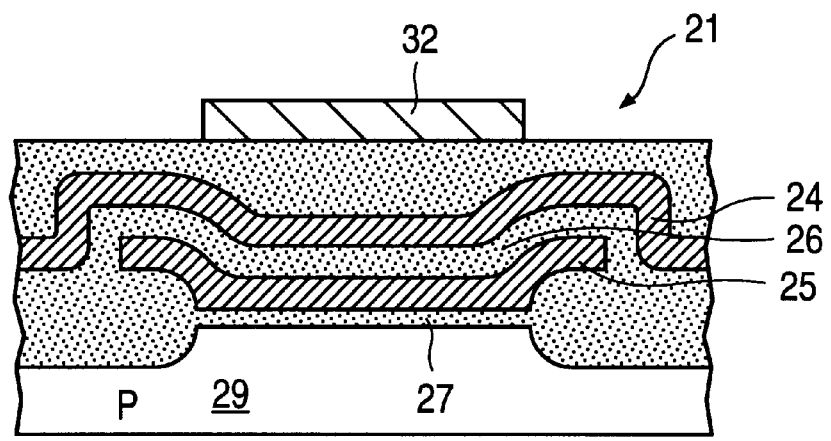

FIG. 2 is a circuit illustration of a conventional NAND array EEPROM consisting of M columns or bit-lines of NAND strings 20. FIG. 3A is a top view of NAND string 20, and FIGS. 3B and 3C are sectional views of NAND string 20 of FIG. 3A along sectional lines B—B and C—C, respectively. NAND string 20 has N memory cells 21 connected between a column or bit-select transistor 22 and a ground-select transistor 23. Each memory cell 21 is a double polysilicon transistor having a polysilicon control gate 24 separated from a polysilicon floating gate 25 by an insulative layer 26. A second insulative layer 27 separates floating gate 25 from an underlying channel region between n-type source/drain diffusion regions 28 within a p-type substrate 29. Select transistors 22 and 23, at the ends of the chain of memory cells 21, each have a single polysilicon select gate 30 and 31 overlying a channel region between source/drain diffusion regions 28. Adjacent memory cells 21 are connected through shared source/drain regions 28, as shown in FIGS. 2 and 3B. Other formations of memory cell 21, such as n-type diffusion regions within a p-type well formed in an n-type silicon substrate, are also suitable.

Bit-lines 32 select the desired NAND string or column in which the selected memory cell is located, and word-lines 33 select the desired row in which the selected memory cell is located. Referring to FIGS. 2, 3A, and 3B, each bit-line 32 is connected to the drain of a bit-select transistor 22, and referring to FIGS. 2, 3A, and 3C, each word line is connected to the control gate 24 continuously formed in the direction of each row of memory cells 21. By applying appropriate voltages to the desired select transistors 22 and 23 and to the desired memory cells 21, a selected one of memory cells 21 can be electrically programmed (or written).

To program a particular memory cell 21 of a NAND array EEPROM, the row and column connected to the desired memory cell are selected, causing electrons in substrate 29 to charged and tunnel into floating gate 25 by Fowler-Nordheim tunneling and raising the threshold voltage of memory cell 21.

Figure 4:
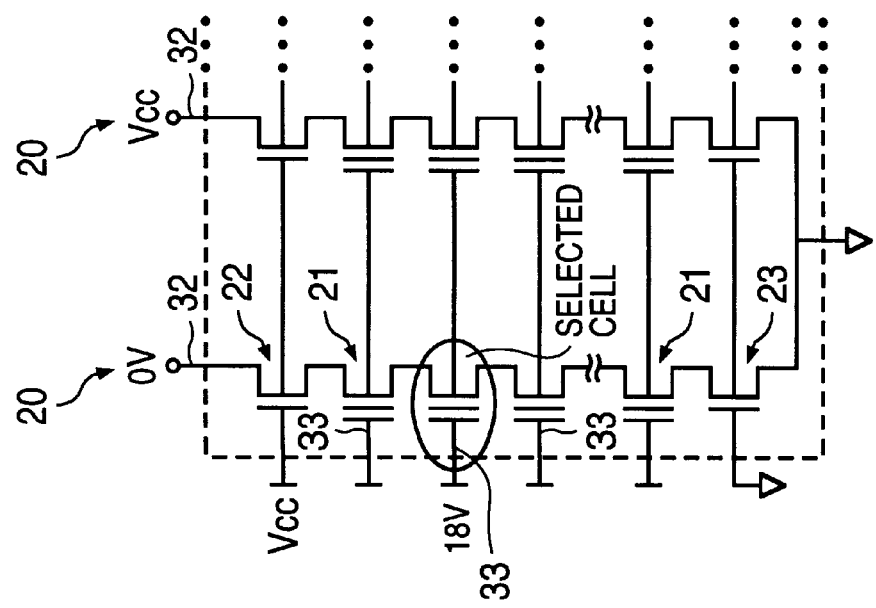
FIG. 4 is a circuit illustration of a conventional programming operation of the NAND array of FIG. 2.

The desired row is selected by applying, for example, a pass voltage (i.e., approximately 10 V) to word-lines 33 unconnected to the desired memory cell and a program voltage (i.e., approximately 18 V) to the word-line 32 connected to the desired memory cell. These voltages are sufficient to pass current through, but not program, the undesired memory cells and program the desired memory cell. The desired column or NAND string 20 is selected by applying, for example, 0 V to the desired one of bit-lines 32 and a supply voltage $V_{cc}$ (i.e., 3 V) to the undesired ones of bit-lines 32. $V_{cc}$ is also applied to the line connecting the select gates of bit-select transistors 22. As a result, the bit-select transistor in the desired NAND string is turned on to allow current to flow through the string, while the bit-select transistors in the undesired NAND strings are turned off to prevent current flow. Adjacent NAND strings are isolated by applying, for example, approximately 0 V or ground to the select gate and source of each ground-select transistor 23 (to turn off transistor 23), as shown in FIG. 4.

By grounding the source of each ground-select transistor 23 during programming operations, transistors 23 connected to unselected NAND strings see a high voltage drop across the source and drain (or channel). As a result, attempts to scale down ground-select transistor 23 are limited by short-channel punchthrough effects, as discussed above.

Figure 5:
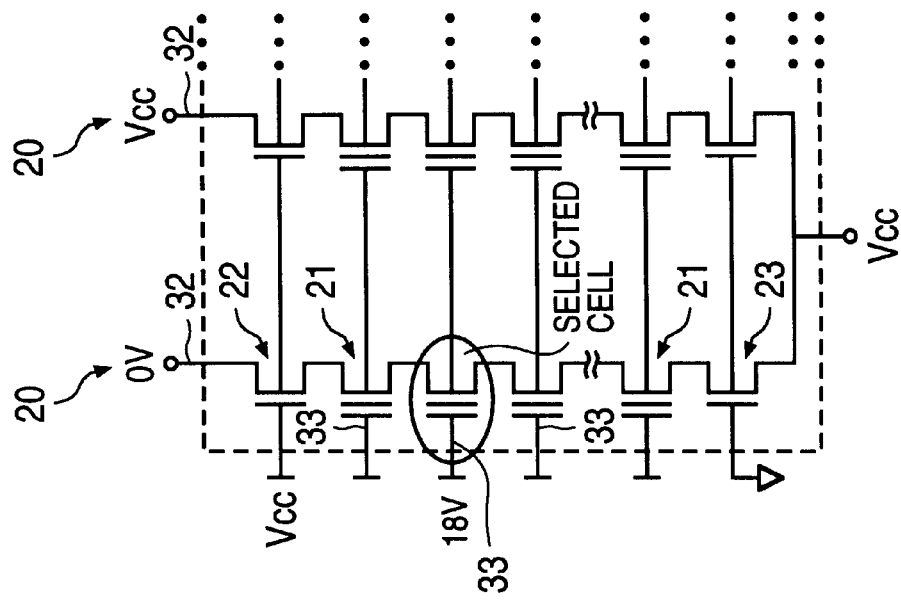
FIG. 5 is a circuit illustration of a programming operation of the NAND array of FIG. 2 according to the present invention.

FIG. 5 is a circuit illustration of NAND string 20 according to the present invention, which is biased by applying $V_{cc}$ to the source of each ground-select transistor during programming to reduce punchthrough limitations during the scaling down of select transistor 23. Most of the same voltages in FIG. 4 can be applied in the present embodiment, shown in FIG. 5. For a program operation, approximately 0 V is applied to the selected one of bit-lines 32, $V_{cc}$ (i.e., 3 V) is applied to the unselected ones of bit-lines 32 and to the gates of bit-select transistors 22, a program voltage of approximately 18 V is applied to the selected one of word-lines 33, a pass voltage of approximately 10 V is applied to the unselected ones of word-lines 33, and 0 volts or ground is applied to the gates of ground-select transistors 23. However, instead of 0 volts, $V_{cc}$ is applied to bias the sources of ground-select transistors 23 according to the present invention.

Current is prevented from leaking from adjacent NAND strings because the channel for each undesired bit-line is boosted to approximately 7 V by applying these voltages during programming. Therefore, the channel side of each unselected bit-select transistor becomes the drain and the side biased at $V_{cc}$ becomes the source because of the higher potential from the channel region, i.e., 7 V vs. 3 V. Since the gate of each bit-select transistor is also biased at $V_{cc}$, the voltage drop across the gate and source is 0 volts, thereby shutting off the transistor and preventing leakage to adjacent NAND strings.

Furthermore, by applying $V_{cc}$ to the source of ground-select transistor 23, the voltage drop across the source and drain is greatly reduced, while still isolating adjacent NAND strings 20 during programming. Consequently, the punchthrough voltage is reduced, allowing the channel of ground-select transistor 23 to be further shortened before attaining punchthrough, without affecting performance. As a result, higher integration density semiconductor memories are possible.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A method of biasing a NAND array during programming of a selected transistor, said array comprising a plurality of NAND strings, each NAND string comprising floating gate transistors coupled between a bit-select transistor and a ground-select transistor, said method comprising:

applying a first voltage to the control gates of the floating gate transistors not connected in the same row as said selected transistor;

applying a second voltage to the control gates of the floating gate transistors connected in the same row as said selected transistor;

applying a third voltage to the select gate of said bit-select transistors;

applying a fourth voltage to the drain of the bit-select transistor connected to the same column as said selected transistor;

applying a fifth voltage to the drains of bit-select transistors not connected to the same column as said selected transistor;

applying a sixth voltage to the select gates of said ground-select transistors; and applying a seventh voltage to the sources of said ground-select transistors to reduce the voltage drop across the source and drain of said ground-select transistors, wherein said seventh voltage is greater than 0 volts.

2. The method of claim 1, wherein said first voltage is a pass voltage to turn on but not program said floating gate transistors.

3. The method of claim 2, wherein said first voltage is approximately 10 volts.

4. The method of claim 1, wherein said second voltage is a program voltage to program said selected transistor.

5. The method of claim 4, wherein said second voltage is approximately 18 volts.

6. The method of claim 1, wherein said third voltage turns on said bit-select transistors.

7. The method of claim 6, wherein said third voltage is the supply voltage.

8. The method of claim 6, wherein said third voltage is approximately 3 volts.

9. The method of claim 8, wherein said fourth voltage is approximately 0 volts.

10. The method of claim 1, wherein said fifth voltage is the supply voltage.

11. The method of claim 10, wherein said fifth voltage is approximately 3 volts.

12. The method of claim 1, wherein said sixth voltage is approximately 0 volts.

13. The method of claim 1, wherein said seventh voltage ranges up to and including the supply voltage.

14. The method of claim 13, wherein said seventh voltage is approximately the supply voltage.

15. The method of claim 1, wherein said select transistors are NMOS transistors.

16. The method of claim 1, wherein said floating transistors are double polysilicon transistors.

17. The method of claim 1, wherein said third and seventh voltages are approximately the same.

* * * * *